(12) United States Patent
Kimura et al.

(10) Patent No.: US 10,890,433 B2
(45) Date of Patent: Jan. 12, 2021

(54) INTERFEROMETRIC THICKNESS MEASURING APPARATUS USING MULTIPLE LIGHT SOURCES COUPLED WITH A SELECTING MEANS

(71) Applicant: DISCO CORPORATION, Tokyo (JP)

(72) Inventors: Nobuyuki Kimura, Tokyo (JP); Keiji Nomaru, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/580,031

(22) Filed: Sep. 24, 2019

(65) Prior Publication Data
US 2020/0103220 A1    Apr. 2, 2020

(30) Foreign Application Priority Data
Sep. 28, 2018    (JP) .................................. 2018-184903

(51) Int. Cl.
| | | |
|---|---|---|
| *G01B 11/06* | (2006.01) | |
| *H01L 21/67* | (2006.01) | |
| *B24B 49/12* | (2006.01) | |
| *G01J 3/02* | (2006.01) | |
| *G01N 21/47* | (2006.01) | |
| *G01J 3/45* | (2006.01) | |

(52) U.S. Cl.
CPC .............. *G01B 11/06* (2013.01); *B24B 49/12* (2013.01); *G01B 11/0675* (2013.01); *G01J 3/0208* (2013.01); *G01J 3/0218* (2013.01); *G01N 21/4788* (2013.01); *H01L 21/67253* (2013.01); *G01J 2003/451* (2013.01)

(58) Field of Classification Search
CPC ................ G01B 11/06; G01B 11/0675; H01L 21/67253; B24B 49/12; G01J 3/18; G01J 3/0218; G01J 3/0208; G01J 2003/451; G01N 21/4788
See application file for complete search history.

(56) References Cited

U.S. PATENT DOCUMENTS

| | | | | |
|---|---|---|---|---|
| 6,847,453 B2 * | 1/2005 | Bush | .................. | G01B 11/0675 356/479 |
| 2007/0100580 A1 * | 5/2007 | Marcus | ................... | H01L 22/12 702/170 |

(Continued)

FOREIGN PATENT DOCUMENTS

| | | |
|---|---|---|
| JP | 2012021916 A | 2/2012 |
| JP | 2018036212 A | 3/2018 |
| JP | 2018063148 A | 4/2018 |

*Primary Examiner* — Michael P LaPage
(74) *Attorney, Agent, or Firm* — Greer Burns & Crain Ltd.

(57) ABSTRACT

A thickness measuring apparatus for measuring a thickness of a wafer includes a light source emitting light having a transmission wavelength region to the wafer, a focusing unit applying the light emitted from the light source to the wafer held on a chuck table, an optical branching section branching the light reflected on the wafer held on the chuck table, a diffraction grating diffracting the reflected light branched by the optical branching section to obtain diffracted light of different wavelengths, an image sensor detecting an intensity of the diffracted light obtained by the diffraction grating to produce a spectral interference waveform, and a computing unit computing the spectral interference waveform produced by the image sensor to output thickness information.

5 Claims, 5 Drawing Sheets

(56) References Cited

U.S. PATENT DOCUMENTS

| | | | |
|---|---|---|---|
| 2010/0195112 A1* | 8/2010 | Davidson | G01B 9/02007 356/498 |
| 2011/0279822 A1* | 11/2011 | Kannaka | G01B 11/2441 356/503 |
| 2014/0168637 A1* | 6/2014 | Wan | G01N 21/45 356/73 |
| 2019/0162660 A1* | 5/2019 | Marcus | G01B 11/0675 |

* cited by examiner

INTERFEROMETRIC THICKNESS MEASURING APPARATUS USING MULTIPLE LIGHT SOURCES COUPLED WITH A SELECTING MEANS

BACKGROUND OF THE INVENTION

Field of the Invention

The present invention relates to a thickness measuring apparatus for measuring the thickness of a wafer by applying light having a transmission wavelength region to the wafer.

Description of the Related Art

A plurality of devices such as integrated circuits (ICs) and large-scale integrations (LSIs) are formed on the front side of a wafer so as to be separated from each other by a plurality of crossing division lines. The back side of the wafer having the plural devices on the front side is ground by a grinding apparatus and then polished by a polishing apparatus to thereby reduce the thickness of the wafer. Thereafter, the wafer is divided along the division lines by a dicing apparatus or a laser processing apparatus to obtain individual device chips. The device chips thus obtained are used in electrical equipment such as mobile phones and personal computers.

The grinding apparatus for grinding the back side of the wafer includes a chuck table for holding the wafer, a grinding unit having a rotatable grinding wheel for grinding the wafer held on the chuck table, and thickness measuring means measuring the thickness of the wafer held on the chuck table, in which the wafer is ground by the grinding wheel as measuring the thickness of the wafer by using the thickness measuring means, so that the thickness of the wafer can be reduced to a desired thickness.

As the thickness measuring means, there is a contact type measuring apparatus using a probe adapted to come into contact with the wafer, thereby measuring the thickness of the wafer. However, when such a contact type measuring apparatus is used, the work surface (back side) of the wafer may be damaged by the probe. To cope with this problem, a noncontact type measuring apparatus is conventionally used (see JP 2012-021916A, JP 2018-036212A, and JP 2018-063148A). The noncontact type measuring apparatus is configured so that light is applied to the work surface of the wafer and a spectral interference waveform is produced from the light reflected on the work surface of the wafer and the light transmitted through the wafer and reflected on the other surface opposite to the work surface, thereby measuring the thickness of the wafer.

SUMMARY OF THE INVENTION

However, in the case of using the noncontact type measuring apparatus, there is a problem such that when the finished thickness of the wafer in grinding the wafer and next polishing the wafer is small (e.g., 10 μm or less), the measurement of the wafer thickness is difficult. More specifically, in measuring the thickness of the wafer by using a light source for emitting light having a transmission wavelength region to the wafer and applying the light emitted from the light source to the wafer, a so-called single-mode optical fiber is used to transmit the light, so as to maintain a good accuracy of the spectral interference waveform to be produced from the light reflected on the upper surface of the wafer and the light reflected on the lower surface of the wafer. The single-mode optical fiber has a core diameter of 3 to 10 μm and transmits only one spatial mode. To introduce the light into the single-mode optical fiber having a small core diameter from an end surface thereof, a super luminescent diode (SLD) lamp for emitting light having characteristics near those of a laser beam is selected as the light source to measure the thickness of the wafer. It is assumed that the SLD lamp emits light having a wavelength band of 900 to 1000 nm and forms a light spot having a diameter of 5 μm. That is, a light source for emitting light having such a narrow wavelength band is selected to measure the thickness of the wafer. As a result, when the thickness of the wafer is a relatively small thickness, e.g., 100 μm or less, especially, 10 μm or less, it is difficult to accurately measure the thickness of the wafer.

In contrast thereto, a halogen lamp for emitting light having a wide wavelength band (e.g., 400 to 900 nm) may be used as the light source to measure the thickness of the wafer. In this case, when the thickness of the wafer is 10 μm or less, the thickness of the wafer can be measured. However, the diameter of a light spot to be formed by the halogen lamp is much greater than the diameter of a light spot to be formed by the SLD lamp. Accordingly, it is difficult to effectively introduce the light emitted from the halogen lamp into a single-mode optical fiber having a small core diameter from the end surface thereof. In this case, therefore, a multimode optical fiber having a core diameter larger than that of the single-mode optical fiber may be used to transmit the light emitted from the halogen lamp. However, in the case of selecting the halogen lamp as the light source and selecting the multimode optical fiber as an optical path for transmitting the light to measure the thickness of the wafer, the light emerging from the multimode optical fiber is too diverged, so that when the thickness of the wafer is more than 100 μm, the thickness of the wafer cannot be accurately measured.

It is therefore an object of the present invention to provide a thickness measuring apparatus which can accurately measure the thickness of a wafer even when the thickness of the wafer changes from a relatively large thickness to a relatively small thickness.

In accordance with an aspect of the present invention, there is provided a thickness measuring apparatus for measuring a thickness of a wafer, the thickness measuring apparatus including a light source emitting light having a transmission wavelength region to the wafer; focusing means applying the light emitted from the light source to the wafer held on a chuck table; an optical path optically connecting the light source and the focusing means; an optical branching section provided on the optical path branching from the optical path the light reflected on the wafer held on the chuck table; a diffraction grating diffracting the reflected light branched by the optical branching section to obtain diffracted light of different wavelengths; an image sensor detecting an intensity of the diffracted light obtained by the diffraction grating to produce a spectral interference waveform; and computing means computing the spectral interference waveform produced by the image sensor to output thickness information; the light source including a first light source for emitting first light having a narrow wavelength band and a second light source for emitting second light having a wide wavelength band wider than the wavelength band of the first light; the optical path including a first optical path for transmitting the first light from the first light source and a second optical path for transmitting the second light from the second light source, the first optical path being formed from a single-mode optical fiber, the second optical path being formed from a multimode optical fiber; the optical branching section including a first optical branching section mounted on the first optical path for branching the first light reflected on the wafer from the first optical path and a second optical branching section mounted on the second optical path for branching the second light reflected on the wafer from the second optical path; the diffraction grating including a first diffraction grating for diffracting the reflected first light branched by the first optical branching section to obtain first diffracted light of different wavelengths and a second diffraction grating for diffracting the reflected second light branched by the second optical branching section to obtain second diffracted light of different wavelengths; the thickness measuring apparatus further including selecting means guiding the first diffracted light obtained by the first diffraction grating to the image sensor when the thickness of the wafer is a first thickness and guiding the second diffracted light obtained by the second diffraction grating to the image sensor when the thickness of the wafer is a second thickness smaller than the first thickness.

Preferably, the first light source is selected from a group consisting of a super luminescent diode lamp and an amplified spontaneous emission lamp, and the second light source is selected from a group consisting of a halogen lamp, a light emitting diode lamp, a xenon lamp, a mercury lamp, and a metal halide lamp.

Preferably, the focusing means has a configuration such that the single-mode optical fiber for guiding the first light and the multimode optical fiber for guiding the second light are juxtaposed and a common focusing lens is used to focus the first light guided by the single-mode optical fiber and the second light guided by the multimode optical fiber. As another configuration of the focusing means, the focusing means may include a multicore fiber and a common focusing lens, the single-mode optical fiber for guiding the first light and the multimode optical fiber for guiding the second light being connected to the multicore fiber, the common focusing lens being located so as to focus the first light guided by the single-mode optical fiber and the second light guided by the multimode optical fiber. As still another configuration of the focusing means, the focusing means may include a double cladding fiber and a common focusing lens, the single-mode optical fiber for guiding the first light and the multimode optical fiber for guiding the second light being connected to the double cladding fiber, the common focusing lens being located so as to focus the first light guided by the single-mode optical fiber and the second light guided by the multimode optical fiber.

According to the thickness measuring apparatus of the present invention, the following effect can be exhibited. In the case where the thickness of the wafer is a relatively large thickness in measuring the thickness of the wafer, the first light emitted from the first light source is used to be reflected on the wafer, and the reflected light from the wafer is diffracted by the first diffraction grating to obtain diffracted light of different wavelengths. This diffracted light is guided to the image sensor. On the other hand, in the case where the thickness of the wafer is a relatively small thickness in measuring the thickness of the wafer, the second light emitted from the second light source is used to be reflected on the wafer, and the reflected light from the wafer is diffracted by the second diffraction grating to obtain diffracted light of different wavelengths. This diffracted light is guided to the image sensor. Accordingly, even when the thickness of the wafer changes from a relatively large thickness to a relatively small thickness, the thickness of the wafer can be accurately measured.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
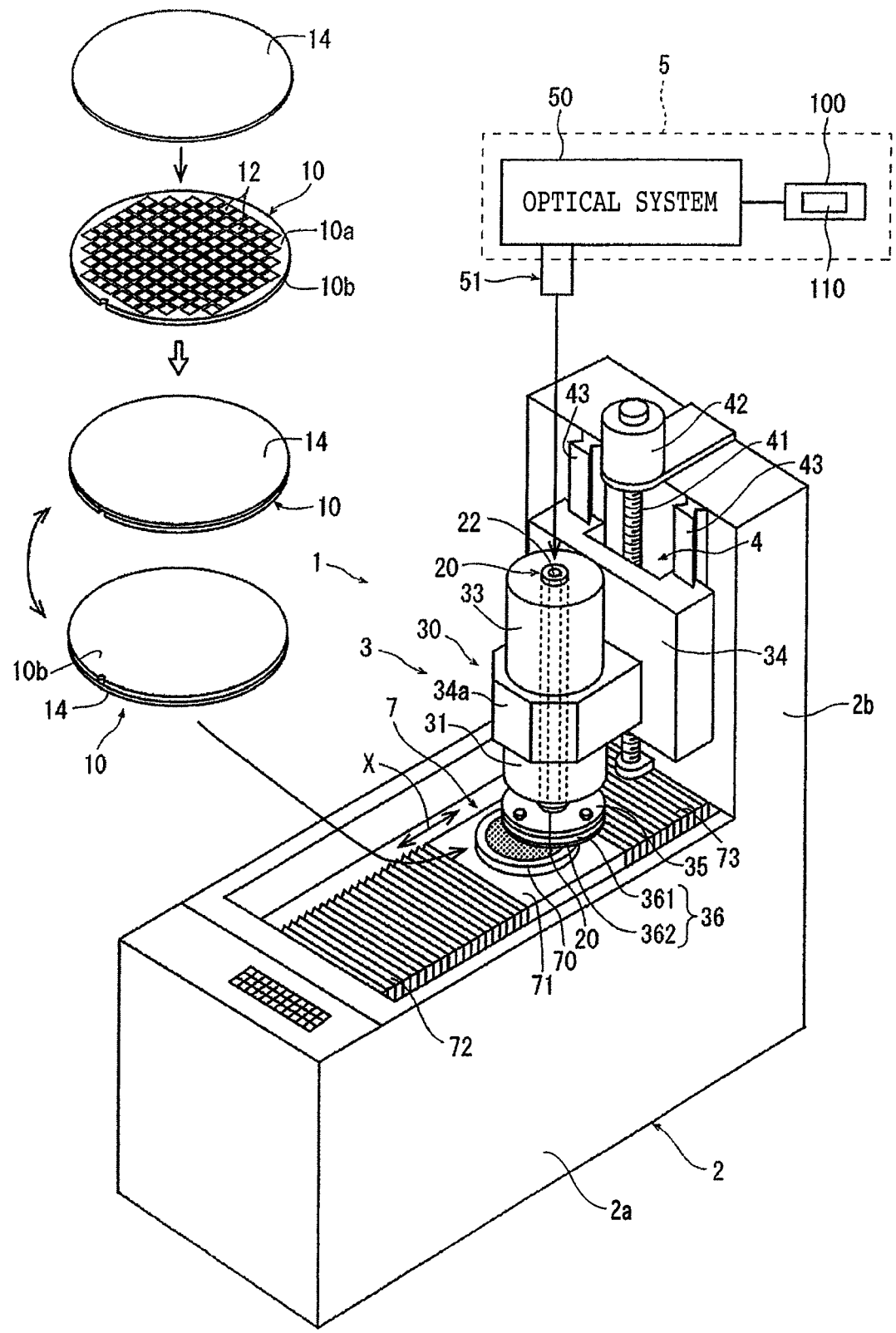
FIG. 1 is a perspective view of a polishing apparatus including a thickness measuring apparatus according to a preferred embodiment of the present invention and a wafer to be polished by the polishing apparatus.

There will now be described in detail a thickness measuring apparatus according to a preferred embodiment of the present invention and a polishing apparatus including the thickness measuring apparatus with reference to the attached drawings. FIG. 1 is a perspective view depicting a polishing apparatus 1 for polishing a wafer 10 as a workpiece. The polishing apparatus 1 includes a polishing unit 3 polishing the wafer 10, a chuck table mechanism 7 for holding the wafer 10, a polishing unit feeding mechanism 4 for vertically moving the polishing unit 3 toward and away from the chuck table mechanism 7, and a thickness measuring apparatus 5 for measuring the thickness of the wafer 10.

The polishing unit 3 includes a movable base 34 and a spindle unit 30 mounted on the movable base 34 through a support block 34a. The polishing apparatus 1 includes a base housing 2. The base housing 2 has a box-shaped main portion 2a and a vertical wall 2b extending upward from the rear end of the main portion 2a. A pair of guide rails 43 are provided on the front surface of the vertical wall 2b so as to extend vertically. The movable base 34 is slidably engaged with the guide rails 43. The spindle unit 30 includes a spindle housing 31, a vertically extending spindle 20 (depicted by broken lines in FIG. 1) rotatably supported to the spindle housing 31, and a servo motor 33 as a drive source for rotationally driving the spindle 20. The spindle 20 has a lower end portion projecting from the lower end of the spindle housing 31. A circular mount 35 is provided at the lower end of the spindle 20. A polishing tool 36 is mounted on the lower surface of the mount 35. The spindle 20 has a circular central through hole 22 formed along the axis of the spindle 20 so as to extend from the upper end of the spindle 20 to the lower end thereof. The mount 35 also has a circular central hole 35a aligned with the central through hole 22 of the spindle 20 (see FIG. 3). The thickness measuring apparatus 5 is schematically depicted in FIG. 1 and includes an optical system 50. The optical system 50 includes focusing means 51 positioned directly above the upper end of the spindle 20.

The polishing unit feeding mechanism 4 includes an externally threaded rod 41 provided on the front side of the vertical wall 2b so as to extend substantially vertically and a pulse motor 42 as a drive source for rotationally driving the externally threaded rod 41. A nut portion (not depicted) is provided on the rear surface of the movable base 34 so as to engage with the externally threaded rod 41. Accordingly, when the pulse motor 42 is normally operated to rotate the externally threaded rod 41 in a forward direction, the movable base 34 is lowered, that is, the spindle unit 30 is lowered, whereas when the pulse motor 42 is reversely operated to rotate the externally threaded rod 41 in a backward direction, the movable base 34 is raised, that is, the spindle unit 30 is raised.

The chuck table mechanism 7 is provided on the main portion 2a of the base housing 2. The chuck table mechanism 7 includes a chuck table 70 as holding means holding the wafer 10, a rectangular plate-shaped cover member 71 surrounding the outer circumference of the chuck table 70, and a pair of bellows 72 and 73 connected to the front and rear ends of the cover member 71. The chuck table 70 has an upper surface (holding surface) for holding the wafer 10 thereon under suction by operating suction means (not depicted). The chuck table 70 is rotatable about its vertical axis by any rotating means (not depicted). Further, the chuck table 70 is movable back and forth in the X direction depicted by an arrow X in FIG. 1 by any moving means (not depicted). More specifically, the chuck table 70 is movable between a standby position (front position) where the wafer 10 is loaded to the chuck table 70 before polishing or the wafer 10 is unloaded from the chuck table 70 after polishing and a polishing position (rear position) where the wafer 10 held on the chuck table 70 is opposed to the polishing tool 36 of the spindle unit 30 and adapted to be polished by the polishing tool 36.

Figure 2:
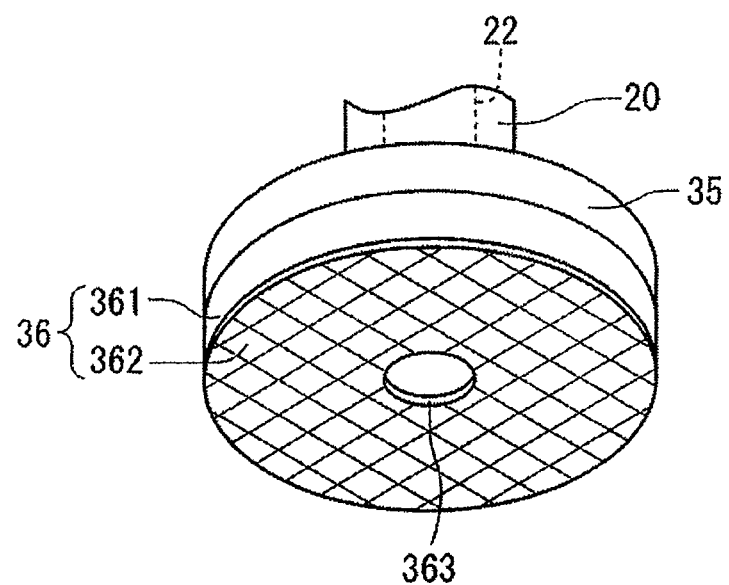
FIG. 2 is a perspective view of a polishing tool included in the polishing apparatus depicted in FIG. 1 as viewed from the lower side of the polishing tool.

FIG. 2 is a perspective view of the polishing tool 36 mounted on the lower surface of the mount 35 as viewed from the lower side. The polishing tool 36 is composed of a disk-shaped support base 361 formed of aluminum alloy and a polishing pad 362 detachably attached through a double-sided adhesive tape or the like to the lower surface of the support base 361. The upper surface of the support base 361 is fixed to the lower surface of the mount 35. The polishing pad 362 is composed of a pad formed from a nonwoven fabric or polyurethane foam, for example, and abrasive grains contained in this pad. That is, the polishing pad 362 is adapted to perform dry polishing without using a slurry. The support base 361 and the polishing pad 362 of the polishing tool 36 have a central hole 363 communicating with the central through hole 22 of the spindle 20 through the central hole 35a of the mount 35. More specifically, the central hole 363 of the polishing tool 36 is aligned with the central hole 35a of the mount 35 and the through hole 22 of the spindle 20. The axis of the through hole 22 coincides with the axis of the spindle 20. The polishing pad 362 is replaceable with a new one. That is, after using the polishing pad 362 for a predetermined period of time, the polishing pad 362 is peeled from the support base 361 and then replaced with a new one.

Figure 3:
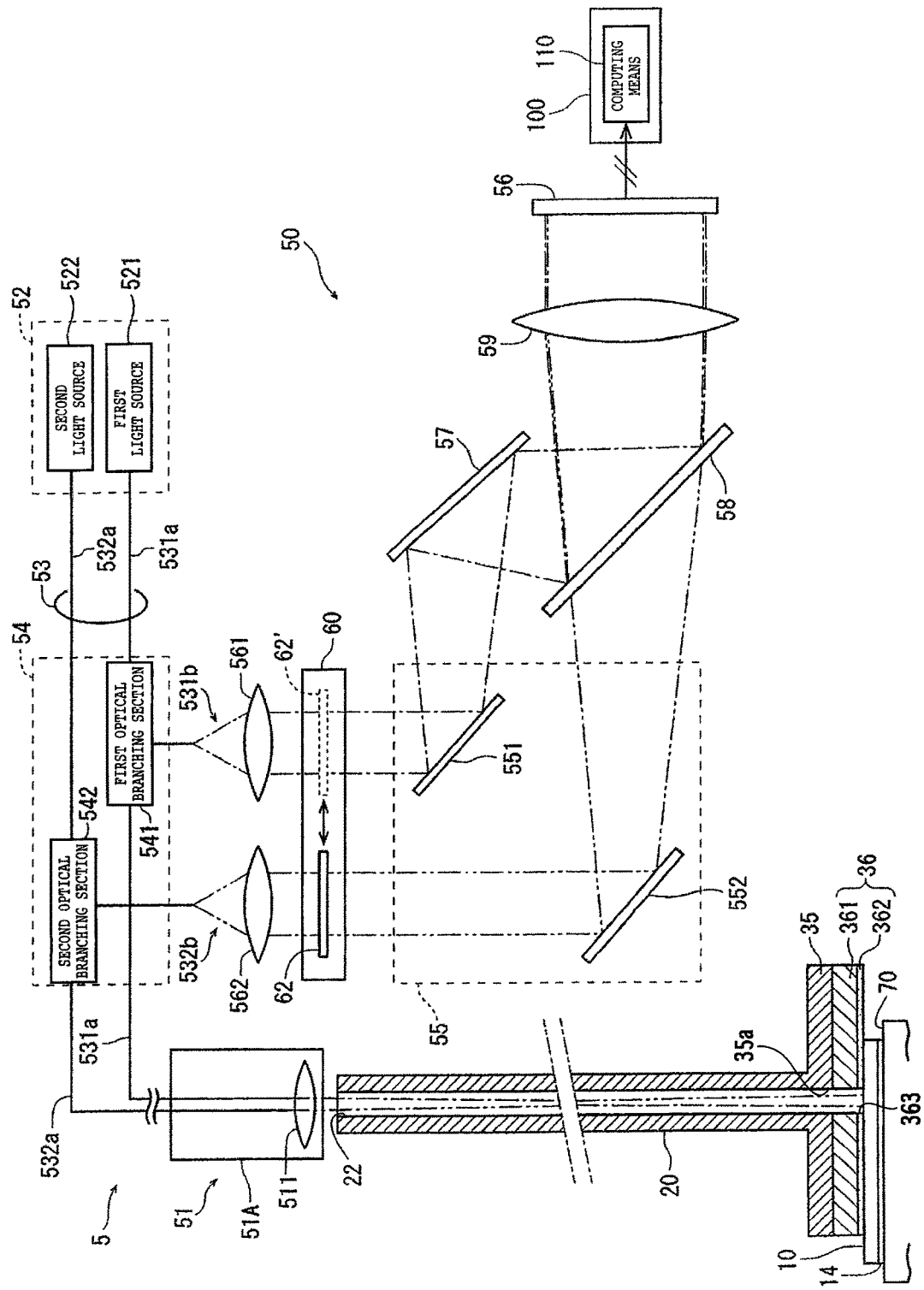
FIG. 3 is a block diagram depicting an optical system configuring the thickness measuring apparatus depicted in FIG. 1.

The thickness measuring apparatus 5 will now be described in more detail with reference to FIG. 3. As depicted in FIG. 3, the thickness measuring apparatus 5 includes an optical system 50 and computing means 110 computing thickness information obtained by the optical system 50. In this preferred embodiment, the polishing apparatus 1 includes a control unit 100 controlling each drive source or driving means mentioned above, and the computing means 110 is included in this control unit 100.

The optical system 50 will now be described in more detail. As depicted in FIG. 3, the optical system 50 includes a light source 52 for emitting light having a transmission wavelength region to the wafer 10, focusing means or a condenser 51 focusing the light emitted from the light source 52 and applying the light to the wafer 10 held on the chuck table 70, an optical path 53 for optically connecting the light source 52 and the focusing means 51, an optical branching section 54 provided on the optical path 53 for branching from the optical path 53 the light reflected from the wafer 10 held on the chuck table 70, a diffraction grating 55 for diffracting the reflected light branched by the optical branching section 54 to obtain diffracted light of different wavelengths, and an image sensor 56 for detecting the intensity of the diffracted light obtained by the diffraction grating 55 to produce a spectral interference waveform. The light applied from the focusing means 51 enters the central through hole 22 of the spindle 20 and then passed through the central through hole 22 of the spindle 20, the central hole 35a of the mount 35, and the central hole 363 of the polishing tool 36 to reach the wafer 10 held on the chuck table 70. Then, the light is reflected on the wafer 10, and the reflected light from the wafer 10 is passed through the central hole 363, the central hole 35a, and the central through hole 22 to reach the optical branching section 54.

The light source 52 includes a first light source 521 for emitting light having a narrow wavelength band (e.g., 910 to 990 nm) and a second light source 522 for emitting light having a wide wavelength band (e.g., 400 to 900 nm) wider than the wavelength band of the light to be emitted from the first light source 521. The first light source 521 may be configured by an SLD lamp, for example, and the second light source 522 may be configured by a halogen lamp, for example. The optical path 53 includes a first optical path 531a for transmitting the light from the first light source 521 toward the focusing means 51 and a second optical path 532a for transmitting the light from the second light source 522 toward the focusing means 51. The first optical path 531a may be configured by a single-mode optical fiber, and the second optical path 532a may be configured by a multimode optical fiber. The single-mode optical fiber has a core diameter of 10 μm or less, and the multimode optical fiber has a core diameter of 50 μm or more (e.g., 50 μm or 62 μm).

The optical branching section 54 includes a first optical branching section 541 mounted on the first optical path 531a and a second optical branching section 542 mounted on the second optical path 532a. Each of the first optical branching section 541 and the second optical branching section 542 may be configured by a fiber coupler. The diffraction grating 55 includes a first diffraction grating 551 and a second diffraction grating 552. The light reflected on the wafer 10 and next branched by the first optical branching section 541 is transmitted through a first branched optical path 531b, a collimation lens 561, and selecting means 60 to the first diffraction grating 551. The collimation lens 561 functions to collimate the reflected light transmitted through the first branched optical path 531b. The selecting means 60 will be hereinafter described in detail. Similarly, the light reflected on the wafer 10 and next branched by the second optical branching section 542 is transmitted through a second branched optical path 532b, a collimation lens 562, and the selecting means 60 to the second diffraction grating 552. The collimation lens 562 functions to collimate the reflected light transmitted through the second branched optical path 532b.

The selecting means 60 includes a shutter 62 adapted to be moved by any driving means (not depicted). The shutter 62 is movable between a first position (depicted by a solid line in FIG. 3) where the first branched optical path 531b is effective and the second branched optical path 532b is interrupted and a second position (depicted by a broken line in FIG. 3) where the second branched optical path 532b is effective and the first branched optical path 531b is interrupted. Thus, the first branched optical path 531b or the second branched optical path 532b is selected by moving the shutter 62 between the first position and the second position in the selecting means 60.

The reflected light diffracted by the first diffraction grating 551 is reflected by a reflecting mirror 57 and a dichroic mirror 58 and next guided through a focusing lens 59 to the image sensor 56. On the other hand, the reflected light diffracted by the second diffraction grating 552 is transmitted through the dichroic mirror 58 and next guided through the focusing lens 59 to the image sensor 56. The dichroic mirror 58 functions to reflect light having a wavelength band of 910 to 990 nm and transmit light having a wavelength band of 400 to 900 nm. The positions of the reflecting mirror 57 and the dichroic mirror 58 are not limited to this preferred embodiment, but may be freely changed according to the optical path for guiding the reflected light.

The image sensor 56 is a so-called line image sensor having a plurality of photodetectors arranged in a line. The image sensor 56 functions to detect the intensity of the reflected light diffracted by the first diffraction grating 551 or the second diffraction grating 552 according to different wavelengths and then output a detection signal indicating the light intensity according to different wavelengths. This detection signal is next transmitted to the control unit 100 to produce a spectral interference waveform.

The control unit 100 is configured by a computer, which includes a central processing unit (CPU) performing computation according to a control program, a read only memory (ROM) previously storing the control program, a readable and writable random access memory (RAM) for temporarily storing detection values, computation results, etc., an input interface, and an output interface. The control unit 100 includes the computing means 110 adapted to be controlled by the control program. The computing means 110 functions to perform Fourier transform to the spectral interference waveform produced by the image sensor 56, thereby performing waveform analysis to output an optical path difference between the reflected light from the upper surface of the wafer 10 and the reflected light from the lower surface of the wafer 10, in which this optical path difference indicates thickness information on the wafer 10.

The focusing means 51 depicted in FIG. 3 is a first type of focusing means 51A having a configuration such that the first optical path 531a formed from a single-mode optical fiber and the second optical path 532a formed from a multimode optical fiber are juxtaposed to introduce the light from the light source 52 into the focusing means 51 and that a common focusing lens 511 is used to focus the first light transmitted through the first optical path 531a and the second light transmitted through the second optical path 532a and then apply both the first light and the second light toward the wafer 10 held on the chuck table 70.

Figure 4A:
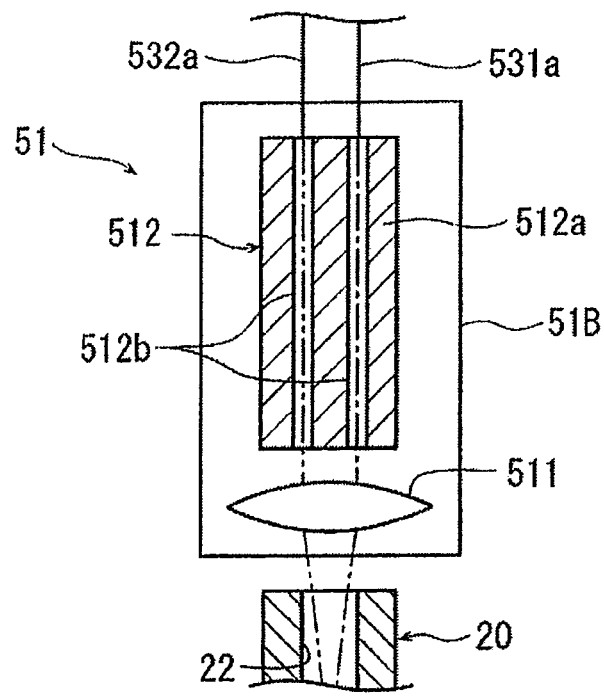
FIG. 4A is a sectional view depicting a modification of focusing means included in the thickness measuring apparatus depicted in FIG. 3.
Figure 4B:
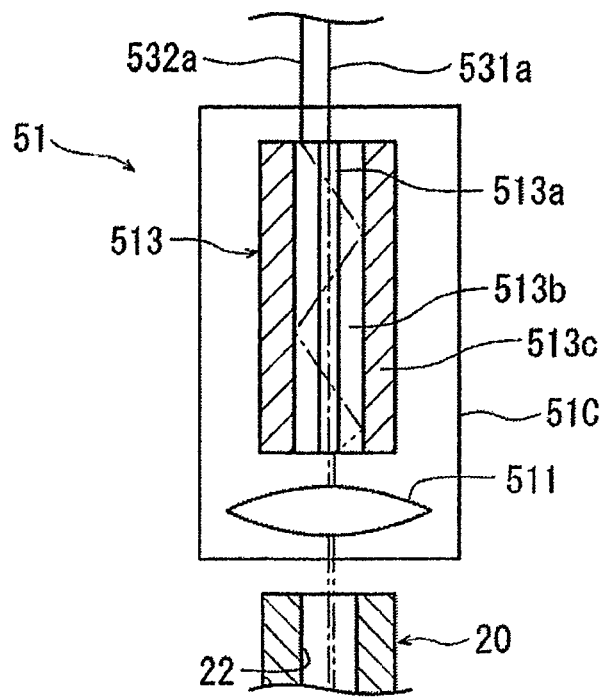
FIG. 4B is a view similar to FIG. 4A, depicting another modification of the focusing means.

The focusing means 51 in the present invention is not limited to the first type of focusing means 51A depicted in FIG. 3. FIG. 4A depicts a second type of focusing means 51B as a modification. As depicted in FIG. 4A, the second type of focusing means 51B includes a multicore fiber 512 composed of a single cladding 512a and at least two cores 512b provided in the cladding 512a. The first optical path 531a formed from a single-mode optical fiber and the second optical path 532a formed from a multimode optical fiber are connected to the two cores 512b of the multicore fiber 512, respectively. The light from the light source 52 is guided through the multicore fiber 512 to a common focusing lens 511 and then applied toward the wafer 10 held on the chuck table 70. That is, the first light transmitted through the first optical path 531a and the second light transmitted through the second optical path 532a are respectively guided through the two cores 512b of the multicore fiber 512 and then focused by the common focusing lens 511. Further, FIG. 4B depicts a third type of focusing means 51C as another modification. As depicted in FIG. 4B, the third type of focusing means 51C includes a double cladding fiber 513 consisting essentially of a core 513a located at the center, a cylindrical first cladding 513b surrounding the outer side surface of the core 513a, and a cylindrical second cladding 513c surrounding the outer side surface of the first cladding 513b, in which the first cladding 513b has a refractive index lower than that of the core 513a, and the second cladding 513c has a refractive index lower than that of the first cladding 513b. The first optical path 531a formed from a single-mode optical fiber is connected to the core 513a of the double cladding fiber 513, and the second optical path 532a formed from a multimode optical fiber is connected to the first cladding 513b of the double cladding fiber 513. The light from the light source 52 is guided through the double cladding fiber 513 to a common focusing lens 511 and then applied toward the wafer 10 held on the chuck table 70. That is, the first light transmitted through the first optical path 531a and the second light transmitted through the second optical path 532a are respectively guided through the core 513a and the first cladding 513b of the double cladding fiber 513 and then focused by the common focusing lens 511.

Any one of the first type of focusing means 51A, the second type of focusing means 51B, and the third type of focusing means 51C may be selected as the focusing means 51 in the present invention. Each of the first, second, and third types of focusing means 51A, 51B, and 51C includes the common focusing lens 511, and the first light transmitted through the first optical path 531a and the second light transmitted through the second optical path 532a are focused by the common focusing lens 511, so that the focusing means 51 can be simplified in configuration. While the focusing lens 511 is depicted as a single lens for convenience of illustration, the focusing lens 511 may be realized by the combination of plural lenses.

The operation of the polishing apparatus 1 including the thickness measuring apparatus 5 will now be described, in which the wafer 10 is polished as measuring the thickness of the wafer 10 by using the thickness measuring apparatus 5 to thereby reduce the thickness of the wafer 10 to a target finished thickness.

In performing the polishing operation, the wafer 10 as a workpiece to be polished is prepared as depicted in FIG. 1 by an operator. The wafer 10 has a front side 10a and a back side 10b opposite to the front side 10a. A plurality of devices 12 are previously formed on the front side 10a of the wafer 10. A protective tape 14 is attached to the front side 10a of the wafer 10 as depicted in FIG. 1. The wafer 10 with the protective tape 14 attached to the front side 10a is inverted so that the back side 10b is oriented upward. Thereafter, the wafer 10 with the protective tape 14 is placed on the chuck table 70 set at the standby position in the condition where the back side 10b of the wafer 10 is oriented upward. Thereafter, the suction means (not depicted) is operated to hold the wafer 10 through the protective tape 14 on the chuck table 70 under suction. Thereafter, an operation panel included in the polishing apparatus 1 is used by the operator to input the target finished thickness of the wafer 10 (e.g., 4 µm). After holding the wafer 10 on the chuck table 70 under suction, the polishing tool 36 is retracted to a raised position and the chuck table 70 is next moved in the X direction to the polishing position directly below the polishing tool 36. In the polishing position, the thickness of the wafer 10 can be measured as polishing the wafer 10. In this polishing position, the polishing pad 362 is rotated and lowered to come into contact with the back side 10b of the wafer 10 under pressure. At this time, the central hole 363 of the polishing pad 362 is opposed to the back side 10b of the wafer 10, and the center of the polishing pad 362 is deviated from the center of the wafer 10. Furthermore, when the chuck table 70 holding the wafer 10 is rotated, the whole of the back side 10b of the wafer 10 is polished by the polishing pad 362 being rotated. The thickness of the wafer 10 before polishing is previously grasped as approximately 250 µm.

After moving the wafer 10 to the polishing position, the servo motor 33 of the polishing unit 3 is operated to rotate the polishing tool 36 at a speed of 500 rpm, for example, and the chuck table 70 is also rotated at a speed of 505 rpm, for example. Thereafter, the polishing unit feeding mechanism 4 is operated to lower the polishing pad 362 toward the chuck table 70 until the polishing pad 362 comes into contact with the upper surface (back side 10b) of the wafer 10. At this time, the polishing pad 362 is lowered at a preset feed speed of 0.5 µm/s, for example. The polishing pad 362 contains abrasive grains. Accordingly, when the polishing pad 362 being rotated is pressed on the back side 10b of the wafer 10, the abrasive grains contained in the polishing pad 362 gradually leak from the surface of the polishing pad 362 to thereby polish the back side 10b of the wafer 10.

When the polishing operation is started, the thickness measuring apparatus 5 is operated. The procedure of the thickness measurement will now be described with reference to FIGS. 3, 5, and 6. In starting the thickness measurement, the first light source 521 for emitting light having a narrow wavelength band (910 to 990 nm) and the second light source 522 for emitting light having a wide wavelength band (400 to 900 nm) are both turned on. As described above, the thickness of the wafer 10 before polishing is approximately 250 µm, which is a relatively large thickness (more than 100 µm). Accordingly, the selecting means 60 is operated to set the shutter 62 at the first position depicted by the solid line in FIG. 3. As a result, the second branched optical path 532b is interrupted by the shutter 62. That is, only the first branched optical path 531b is selected. The light emitted from the first light source 521 is transmitted through the first optical path 531a, the focusing means 51, the through hole 22 of the spindle 20, the central hole 35a of the mount 35, and the central hole 363 of the polishing tool 36, and then applied to the wafer 10. Accordingly, the light applied to the wafer 10 is reflected on the upper surface (back side 10b) of the wafer 10 and on the lower surface (front side 10a) of the wafer 10. Thereafter, the reflected light from the wafer 10 is transmitted through the central hole 363 of the polishing tool 36, the central hole 35a of the mount 35, the through hole 22 of the spindle 20, the focusing means 51, and the first optical path 531a to reach the first optical branching section 541. The reflected light is next guided to the first branched optical path 531b by the first optical branching section 541. Similarly, the light emitted from the second light source 522 is also reflected on the wafer 10, and the reflected light is guided to the second branched optical path 532b by the second optical branching section 542. However, since the second branched optical path 532b is interrupted by the shutter 62 of the selecting means 60, the reflected light from the wafer 10 is guided through only the first branched optical path 531b to the first diffraction grating 551.

The reflected light guided to the first diffraction grating 551 is diffracted by the first diffraction grating 551 to obtain diffracted light of different wavelengths. Thereafter, the diffracted light is reflected by the reflecting mirror 57 and the dichroic mirror 58 and then guided to the image sensor 56. The intensity of the diffracted light is then detected according to the different wavelengths by the image sensor 56, and a detection signal from the image sensor 56 is transmitted to the control unit 100. The detection signal from the image sensor 56 indicates the light intensity according to the different wavelengths, and a spectral interference waveform W1 depicted in FIG. 5 is produced according to this detection signal.

Figure 5:
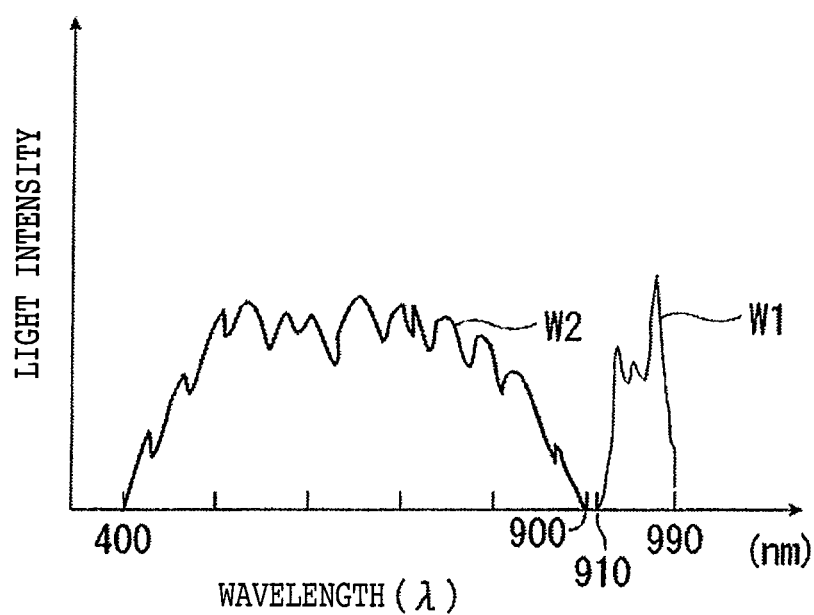
FIG. 5 is a graph depicting spectral interference waveforms produced by an image sensor included in the thickness measuring apparatus depicted in FIG. 3.
Figure 6:
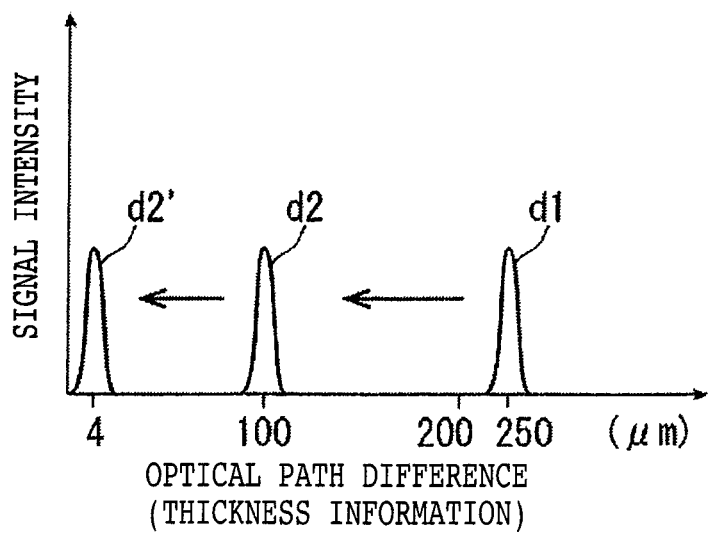
FIG. 6 is a graph depicting waveforms of signal intensity as obtained by the waveform analysis of the spectral interference waveforms depicted in FIG. 5.

The computing means 110 performs Fourier transform to the spectral interference waveform W1 depicted in FIG. 5 to thereby perform waveform analysis. That is, a waveform d1 of signal intensity is obtained as depicted in FIG. 6. In FIG. 6, the value on the horizontal axis corresponding to the peak position of the waveform d1 indicates an optical path difference between the reflected light from the upper surface of the wafer 10 and the reflected light from the lower surface of the wafer 10. Thus, the optical path difference is 250 µm, which is the thickness of the wafer 10, and this value is output as thickness information.

When the polishing operation continues to be performed, the thickness of the wafer 10 is gradually reduced. Accordingly, the spectral interference waveform W1 obtained by the light from the first light source 521 is changed, so that the waveform d1 obtained by the waveform analysis of the spectral interference waveform W1 is shifted in the direction depicted by an arrow in FIG. 6, or leftward as viewed in FIG. 6. Accordingly, the value on the horizontal axis corresponding to the peak position of the waveform d1 is also moved leftward as viewed in FIG. 6, so that the gradual reduction in thickness of the wafer 10 is grasped. In the case where the thickness information is obtained by applying the light having a narrow wavelength band from the first light source 521 to the wafer 10 as in this preferred embodiment, the accuracy of the thickness information may be decreased with a decrease in thickness of the wafer 10. To cope with this problem, the following method is performed in this preferred embodiment. When the optical path difference corresponding to the peak position of the waveform d1 depicted in FIG. 6 reaches 100 µm, which is a relatively small thickness, the shutter 62 of the selecting means 60 is moved to the second position depicted by the broken line in FIG. 3. As a result, the first branched optical path 531b is interrupted by the shutter 62, and the reflected light is guided through only the second branched optical path 532b by the second optical branching section to the second diffraction grating 552.

Thus, the light emitted from the second light source 522 is reflected on the wafer 10, and the reflected light from the wafer 10 is guided to only the second diffraction grating 552, in which the reflected light is diffracted to obtain diffracted light of different wavelengths. The diffracted light is next transmitted through the dichroic mirror 58 and the focusing lens 59 and then guided to the image sensor 56. The intensity of the diffracted light is then detected according to the different wavelengths by the image sensor 56, and a detection signal from the image sensor 56 is transmitted to the control unit 100 to produce a spectral interference waveform W2 depicted in FIG. 5. As apparent from FIG. 5, the spectral interference waveform W2 is formed by the light having a wide wavelength band, and it is therefore suitable for the measurement of the relatively small thickness of the wafer 10, e.g., a thickness of 100 µm or less, especially, 10 µm or less.

Thereafter, the waveform analysis using Fourier transform is performed to the spectral interference waveform W2 to obtain a waveform d2 of signal intensity as depicted in FIG. 6. It can be grasped that the thickness of the wafer 10 is 100 µm from the value on the horizontal axis corresponding to the peak position of the waveform d2 as depicted in FIG. 6. Thereafter, the polishing operation for the wafer 10 is continued as measuring the thickness of the wafer 10 by using the thickness measuring apparatus 5, so that the waveform d2 is further moved leftward as viewed in FIG. 6 to reach a waveform d2' whose peak position corresponds to a thickness of 4 µm. Accordingly, it is determined that the thickness of the wafer 10 has reached the target finished thickness, and the polishing operation is ended.

According to this preferred embodiment, the following effect can be exhibited. In the case where the thickness of the wafer 10 is a relatively large thickness, e.g., more than 100 µm in measuring the thickness of the wafer 10, the light having a narrow wavelength band is emitted from the first optical source 521 and transmitted through the first optical path 531a. This light is reflected on the wafer 10 and the reflected light from the wafer 10 is guided to the first diffraction grating 551 to obtain diffracted light of different wavelengths. This diffracted light is guided to the image sensor 56. On the other hand, in the case where the thickness of the wafer 10 is a relatively small thickness, e.g., 100 µm or less in measuring the thickness of the wafer 10, the light having a wide wavelength band is emitted from the second light source 522 and transmitted through the second optical path 532a. This light is reflected on the wafer 10 and the reflected light from the wafer 10 is guided to the second diffraction grating 552 to obtain diffracted light of different wavelengths. This diffracted light is guided to the image sensor 56. Accordingly, even when the thickness of the wafer 10 changes from a relatively large thickness to a relatively small thickness in the polishing operation, the thickness of the wafer 10 can be accurately measured with a simple configuration.

In the above preferred embodiment, the thickness of the wafer 10 initially having a relatively large thickness is measured by using the first light source 521 for emitting the light having a narrow wavelength band (910 to 990 nm). Thereafter, when the thickness of the wafer 10 is reduced to 100 µm or less, the second light source 522 for emitting the light having a wide wavelength band (400 to 900 nm) is used to measure the thickness of the wafer 10. However, this configuration is merely illustrative. For example, when the thickness of the wafer 10 is more than 25 µm, the light emitted from the first light source 521 may be used to measure the thickness of the wafer 10, whereas when the thickness of the wafer 10 reaches 25 µm, the light emitted from the first light source 521 may be switched to the light emitted from the second light source 522 to measure the thickness of the wafer 10.

While an SLD lamp is used as the first light source 521 for emitting the light having a narrow wavelength band in this preferred embodiment, the present invention is not limited to this configuration. For example, an amplified spontaneous emission (ASE) lamp may be used as the first light source 521. Further, while a halogen lamp is used as the second light source 522 for emitting the light having a wide wavelength band in this preferred embodiment, the present invention is not limited to this configuration. For example, any one of a light emitting diode (LED) lamp, xenon lamp, mercury lamp, and metal halide lamp may also be selected as the second light source 522.

The width of the wavelength band of the light to be emitted from each of the first light source 521 and the second light source 522 may be suitably changed according to the thickness of the wafer 10. Both the first optical branching section 541 and the second optical branching section 542 constituting the optical branching section 54 may be selected from a polarization maintaining fiber coupler, polarization maintaining fiber circulator, single-mode fiber coupler, and single-mode fiber coupler circulator.

In the above preferred embodiment, both the first light source 521 and the second light source 522 are turned on simultaneously in measuring the thickness of the wafer 10, and the selecting means 60 is operated to use the reflected light applied from one of the two light sources 521 and 522 according to the thickness of the wafer 10. However, the present invention is not limited to this configuration. That is, in measuring the thickness of the wafer 10 having a relatively large thickness, only the first light source 521 may be turned on and the second light source 522 may be turned off. Accordingly, the light emitted from only the first light source 521 is guided to the first diffraction grating 551 and the diffracted light from the first diffraction grating 551 is then guided to the image sensor 56, thereby measuring the thickness of the wafer 10. On the other hand, in measuring the thickness of the wafer 10 having a relatively small thickness, the first light source 521 may be turned off and only the second light source 522 may be turned on. Accordingly, the light emitted from only the second light source 522 is guided to the second diffraction grating 552 and the diffracted light from the second diffraction grating 552 is then guided to the image sensor 56, thereby measuring the thickness of the wafer 10.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A thickness measuring apparatus for measuring a thickness of a wafer, the thickness measuring apparatus comprising:
 a light source emitting light having a transmission wavelength region to the wafer;
 focusing means applying the light emitted from the light source to the wafer held on a chuck table;
 an optical path optically connecting the light source and the focusing means;
 an optical branching section provided on the optical path branching from the optical path the light reflected on the wafer held on the chuck table;

a diffraction grating diffracting the reflected light branched by the optical branching section to obtain diffracted light of different wavelengths;

an image sensor detecting an intensity of the diffracted light obtained by the diffraction grating to produce a spectral interference waveform; and computing means computing the spectral interference waveform produced by the image sensor to output thickness information, the light source including a first light source for emitting first light having a narrow wavelength band and a second light source for emitting second light having a wide wavelength band wider than the wavelength band of the first light, the optical path including a first optical path for transmitting the first light from the first light source and a second optical path for transmitting the second light from the second light source, the first optical path being formed from a single-mode optical fiber, the second optical path being formed from a multimode optical fiber, the optical branching section including a first optical branching section mounted on the first optical path for branching the first light reflected on the wafer from the first optical path and a second optical branching section mounted on the second optical path for branching the second light reflected on the wafer from the second optical path, the diffraction grating including a first diffraction grating for diffracting the reflected first light branched by the first optical branching section to obtain first diffracted light of different wavelengths and a second diffraction grating for diffracting the reflected second light branched by the second optical branching section to obtain second diffracted light of different wavelengths, the thickness measuring apparatus further comprising selecting means guiding the first diffracted light obtained by the first diffraction grating to the image sensor when the thickness of the wafer is a first thickness and guiding the second diffracted light obtained by the second diffraction grating to the image sensor when the thickness of the wafer is a second thickness smaller than the first thickness.

2. The thickness measuring apparatus according to claim 1, wherein the first light source is selected from a group consisting of a super luminescent diode lamp and an amplified spontaneous emission lamp, and the second light source is selected from a group consisting of a halogen lamp, a light emitting diode lamp, a xenon lamp, a mercury lamp, and a metal halide lamp.

3. The thickness measuring apparatus according to claim 1, wherein the focusing means has a configuration such that the single-mode optical fiber for guiding the first light and the multimode optical fiber for guiding the second light are juxtaposed and a common focusing lens is used to focus the first light guided by the single-mode optical fiber and the second light guided by the multimode optical fiber.

4. The thickness measuring apparatus according to claim 1, wherein the focusing means includes a multicore fiber and a common focusing lens, the single-mode optical fiber for guiding the first light and the multimode optical fiber for guiding the second light being connected to the multicore fiber, the common focusing lens being located so as to focus the first light guided by the single-mode optical fiber and the second light guided by the multimode optical fiber.

5. The thickness measuring apparatus according to claim 1, wherein the focusing means includes a double cladding fiber and a common focusing lens, the single-mode optical fiber for guiding the first light and the multimode optical fiber for guiding the second light being connected to the double cladding fiber, the common focusing lens being located so as to focus the first light guided by the single-mode optical fiber and the second light guided by the multimode optical fiber.

* * * * *